US012646562B2

(12) United States Patent
Shimanovich et al.

(10) Patent No.: US 12,646,562 B2
(45) Date of Patent: Jun. 2, 2026

(54) FLEXIBLE SRAM CELL ASSIST BY COMBINING WL AND SELECTIVE SRAM CELL SUPPLY

(71) Applicant: International Business Machines Corporation, Armonk, NY (US)

(72) Inventors: Klimentiy Shimanovich, Ramat Gan (IL); Elazar Kachir, Haifa (IL); Noam Jungmann, Holon (IL); Tomer Abraham Cohen, Binyamina (IL); Bishan He, Poughkeepsie, NY (US); Rajiv Joshi, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 87 days.

(21) Appl. No.: 18/617,275

(22) Filed: Mar. 26, 2024

(65) Prior Publication Data

US 2025/0308584 A1 Oct. 2, 2025

(51) Int. Cl.
G11C 11/419 (2006.01)
G11C 5/14 (2006.01)
G11C 11/418 (2006.01)

(52) U.S. Cl.
CPC .............. G11C 11/419 (2013.01); G11C 5/14 (2013.01); G11C 11/418 (2013.01)

(58) Field of Classification Search
CPC ........ G11C 11/418; G11C 11/419; G11C 5/14
USPC ................................................... 365/189.011
See application file for complete search history.

(56) References Cited

U.S. PATENT DOCUMENTS

| | | | |
|---|---|---|---|
| 7,564,725 B2 | 7/2009 | Houston | |
| 9,460,776 B2 | 10/2016 | Dally | |
| 9,548,104 B1 | 1/2017 | Braceras et al. | |
| 2007/0025169 A1* | 2/2007 | Houston ................. | G11C 8/08 365/206 |
| 2007/0274124 A1* | 11/2007 | Otsuka ................. | G11C 11/417 365/154 |
| 2013/0064006 A1 | 3/2013 | Garg et al. | |
| 2013/0121065 A1 | 5/2013 | Agarwal et al. | |

(Continued)

OTHER PUBLICATIONS

Jungmann et al., U.S. Appl. No. 18/302,148, filed Apr. 18, 2023, 35 pgs.

(Continued)

*Primary Examiner* — Sung Il Cho
(74) *Attorney, Agent, or Firm* — Yuanmin Cai, Esq; Kevin P. Radigan, Esq.; Heslin Rothenberg Farley & Mesiti P.C.

(57) ABSTRACT

Embodiment herein describe read and write assists for SRAM cells. When performing a write operation, a write assist technique can be performed on the SRAM macro where a word line (WL) for the selected row is boosted to a voltage above the voltage supply. In addition, cell supply voltages for unselected columns are boosted to prevent the boosted WL from flipping bit values in unselected cells. When performing a read operation, a read assist technique can be performed on the SRAM macro, where the Vcell for the selected column is boosted to a voltage above the voltage supply. In another embodiment, the WL for the selected row of the read operation can also be boosted for enhancing the read performance.

14 Claims, 7 Drawing Sheets

(56) References Cited

U.S. PATENT DOCUMENTS

| 2015/0117094 | A1* | 4/2015 | Cheng | G11C 11/413 |
| | | | | 365/156 |
| 2022/0036942 | A1 | 2/2022 | Wang et al. | |
| 2022/0139450 | A1 | 5/2022 | Fujiwara et al. | |
| 2022/0405057 | A1* | 12/2022 | Berdan | H03M 1/34 |
| 2024/0355365 | A1 | 10/2024 | Jungmann et al. | |

OTHER PUBLICATIONS

Kim et al., Bitline Charge Sharing Suppressed Bitline and Cell Supply Collapse Assists for Energy-Efficient 6T SRAM, IEEE Access, Apr. 5, 2021.
Chang et al., A 20nm 112Mb SRAM in High-? Metal-Gate with Assist Circuitry for Low-Leakage and Low-VMIN Applications, ISSCC 2013 / Session 18 / Advanced Embedded SRAM / 18.1, ISSCC 2013, Feb. 20, 2013.
Song et al., A 14 nm FinFET 128 Mb SRAM With VMIN Enhancement Techniques for Low-Power Applications, IEEE Journal of Solid-State Circuits, vol. 50, No. 1, Jan. 2015.
Joshi et al., 14nm FinFET Based Supply Voltage Boosting Techniques for Extreme Low Vmin Operation, 2015 Symposium on VLSI Circuits Digest of Technical Papers.
Zhang et al., A 3-GHz 70-Mb SRAM in 65-nm CMOS Technology With Integrated Column-Based Dynamic Power Supply, IEEE Journal of Solid-State Circuits, vol. 41, No. 1, Jan. 2006.

\* cited by examiner

300

Determine a selected row and a selected column for a write operation 305

Boost the WL for the selected row 310

Boost Vcells for the unselected columns 315

Perform the write operation 320

600

Determine a selected row and a selected column for a read operation 605

Boost the Vcell for the selected column 610

Boost WL for the selected row 615

Perform the read operation 620

FLEXIBLE SRAM CELL ASSIST BY COMBINING WL AND SELECTIVE SRAM CELL SUPPLY

BACKGROUND

The present invention relates to Static random-access memory (SRAM) cells, and more specifically, to techniques to assist SRAM cells to perform read and write operations.

In SRAM memories, read and write operations are often supported by various assist circuits, aimed to improve writ-ability, stability, or readability. Stability in SRAM cells refers to the ability of the memory cell to maintain its stored data during evaluation time and under various operating conditions. It is crucial to ensure that the cell retains the correct logic state ('0' or '1') after a read operation. Stability is essential to prevent data corruption and read errors. When the voltage at the '0' storing node (NT) exceeds the thresh-old voltage of an NMOS transistor of an opposite inverter, then the node can flip the value from '1' to '0', causing an error.

Six transistors (6T) SRAM cells can suffer from poor stability. The stability of SRAM cells is highly affected from process variations. As such, 6T-SRAM cells can become unstable, and the stored bit value can switch to an opposite value. This in turn leads to decrease in yield during manu-facturing. In addition, the read time of SRAM cells can be long and degrade the chip performance (cycle time).

SUMMARY

According to one embodiment of the present invention, a SRAM is disclosed that includes an array comprising rows and columns of SRAM cells, a plurality of word lines (WLs) corresponding to the rows of the SRAM cells, and a plurality of cell supply voltages (Vcells) for powering the columns of the SRAM cells. The SRAM is configured to, during a write operation, boost a first WL of the plurality of WLs for a selected row of the rows of the SRAM cells, and boost a set of Vcells of the plurality of Vcells for powering unselected columns of the columns of the SRAM cells.

According to one embodiment of the present invention, a method is disclosed that includes determining a selected row and a selected column for a write operation in an array of SRAM cells, boosting a first WL for the selected row during the write operation, and boosting a set of Vcells for pow-ering unselected columns in the array of SRAM cells during the write operation.

According to one embodiment of the present invention, a SRAM is disclosed that includes an array comprising rows and columns of SRAM cells, a plurality of word lines (WLs) corresponding to the rows of the SRAM cells, and a plurality of cell supply voltages (Vcells) for powering the columns of the SRAM cells. The SRAM is configured to, during a read operation, boost a first Vcell of the plurality of Vcells for a selected column of the columns of the SRAM cells and power a first WL of the plurality of WLs for a selected row of the rows of the SRAM cells.

DETAILED DESCRIPTION

Figure 1:
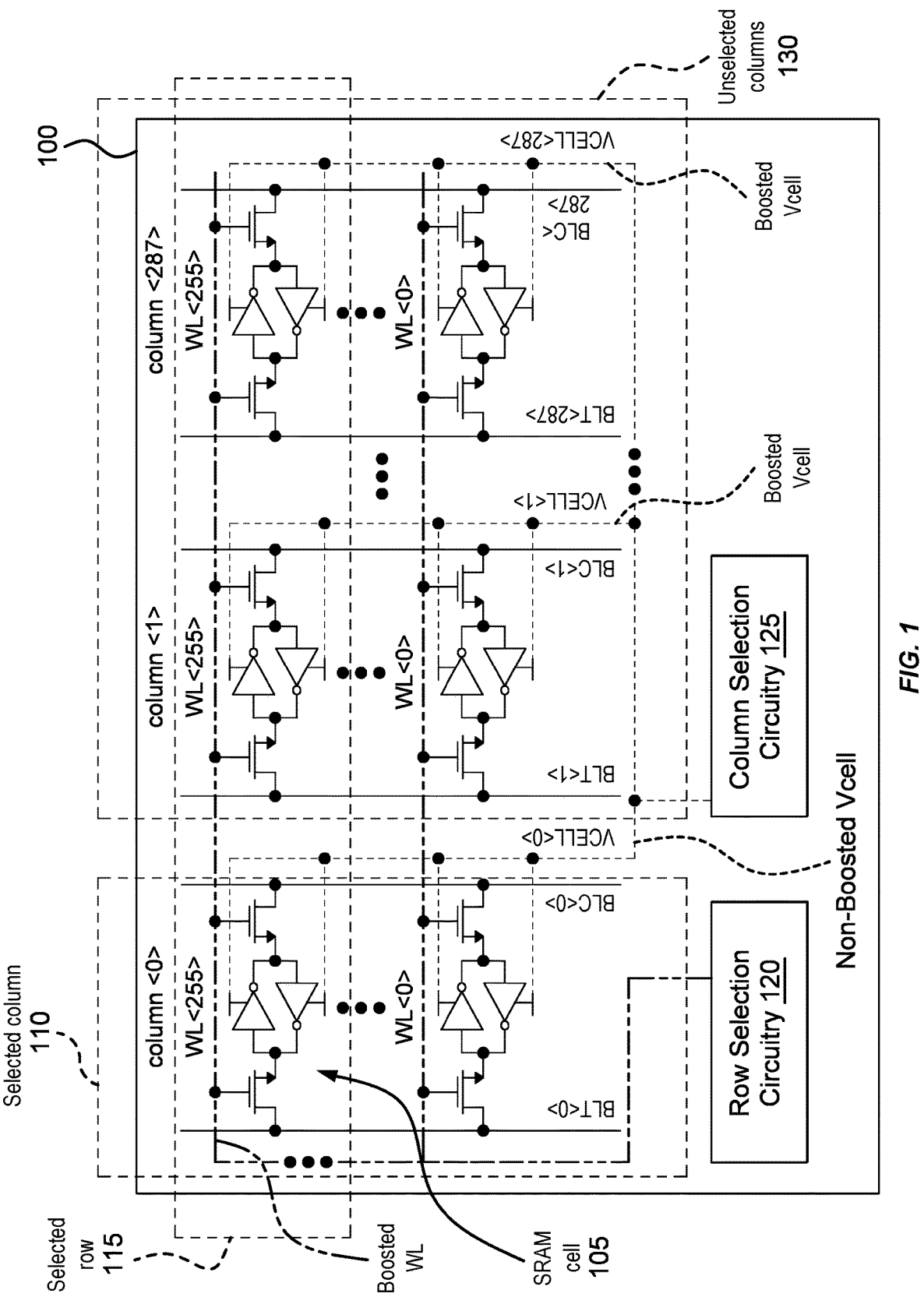
FIG. 1 illustrates a write assist technique for a SRAM, according to one embodiment.

Embodiments herein describe read and write assist tech-niques for SRAM cells. While the example below are described in the context of 6T SRAM cells, they can be applied to any SRAM cell structure that may be small or weak, and as result, suffer from poor writability, stability, or readability.

When performing a write operation, a write assist tech-nique can be performed on the SRAM cell where a word line (WL) for the selected row is boosted to a voltage above the supply voltage. This makes a PG transistor in the SRAM cell driven by the WL stronger compared to a PU transistor (e.g., enables the PG transistor to more easily discharge the NT node) and makes it easier to flip the SRAM cell to the new write value. However, the rest of the SRAM cells in unse-lected columns connected to the selected WL are not written and boosting the WL can cause those SRAM cells in the unselected columns (i.e., columns not being written to) to have stability issues where their stored bit values can inadvertently flip. To prevent this, when boosting the WL, a cell supply voltage (Vcell) for the unselected columns can be boosted, which advantageously prevents the values in the unselected columns from flipping. The Vcell for the selected column should remain non-boosted to make easier to write the cell (e.g., have a smaller voltage than the Vcells for the unselected columns).

When performing a read operation, a read assist technique can be performed on the SRAM cell, where Vcell of the selected column is boosted to a voltage above the supply voltage. Boosting Vcell for the selected column can strengthen the stability and increase the cell current. More-over, during a read operation the memory can open a WL which opens each of the bits on the WL to a read. Even if only 1 bit of the entire row is read, each of the bits in the row may be partially read. Thus, each of the bits in the row (including the selected bit for read) are sensitive to stability during a read operation. As such, in one embodiment, the Vcell for the unselected columns can also be boosted, along with the Vcell of the selected column. For example, opening a SRAM row does not necessarily mean the memory will read all the cells in that row, as there can be muxing downstream that selects to read from a subset of the cells on the row. Even if such muxing exist, the unselected cells that are not being fully read may still be subject to stability concern, and thus, benefit from Vcell boosting. As such, if the SRAM is reading a partial row, it may boost the Vcell for each of the cells on the row.

Although boosting Vcell may be sufficient to result in stable and satisfactory performance, in addition to boosting the Vcell of the selected column, in one embodiment the WL for the selected row is also boosted along with the Vcell during the read operation. Boosting the WL for the selected row can improve the stability sensitivity for the selected row and can result in faster read time operation (e.g., a faster bit line discharge rate), and reducing the read time enables faster cache cycle time of the SRAM.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

FIG. 1 illustrates a write assist technique for a SRAM 100, according to one embodiment. The SRAM 100 includes multiple rows and columns of SRAM cells 105 that form a SRAM array. In this example, the SRAM 100 includes an array of 288 columns (labeled 0-287) and 256 rows (labeled 0-255) of SRAM cells 105. However, this is just one example array for a SRAM, and any dimensions are contemplated.

FIG. 1 also illustrates selecting a column (e.g., selected column 110) and a row (e.g., selected row 115) where a write operation is desired. That is, in this example, the SRAM 100 is performing a write operation on the SRAM cell 105 which is disposed at the intersection of the selected column 110 and the selected row 115, but not at any other cell. That is, the SRAM 100 may be able to perform write operations at one cell along a selected row 115. The SRAM 100 can write to a SRAM cell in one of the columns (e.g., a first subset of SRAM cells) in the selected row 110 in the same write operation, while the other SRAM cells in the selected row are not written to (e.g., a second subset of SRAM cells). In that case, only one of the columns in the SRAM 100 would be selected while the other columns would be unselected.

The SRAM 100 includes row selection circuitry 120 and column selection circuitry 125 for selectively boosting WLs and Vcells in the SRAM 100. In this example, the row selection circuitry 120 selects the WL<255> which corresponds to the selected row 115. The row selection circuitry 120 does not power the other WLs in the SRAM 100 (i.e., WLs<0-254>). In addition to powering the WL<255>, the row selection circuitry 120 also boosts the voltage on the WL<255> so it exceeds the voltage of the power supply coupled to the row selection circuitry. One implementation of the row selection circuitry 120 and boost circuitry is provided in FIG. 7 below.

Figure 2:
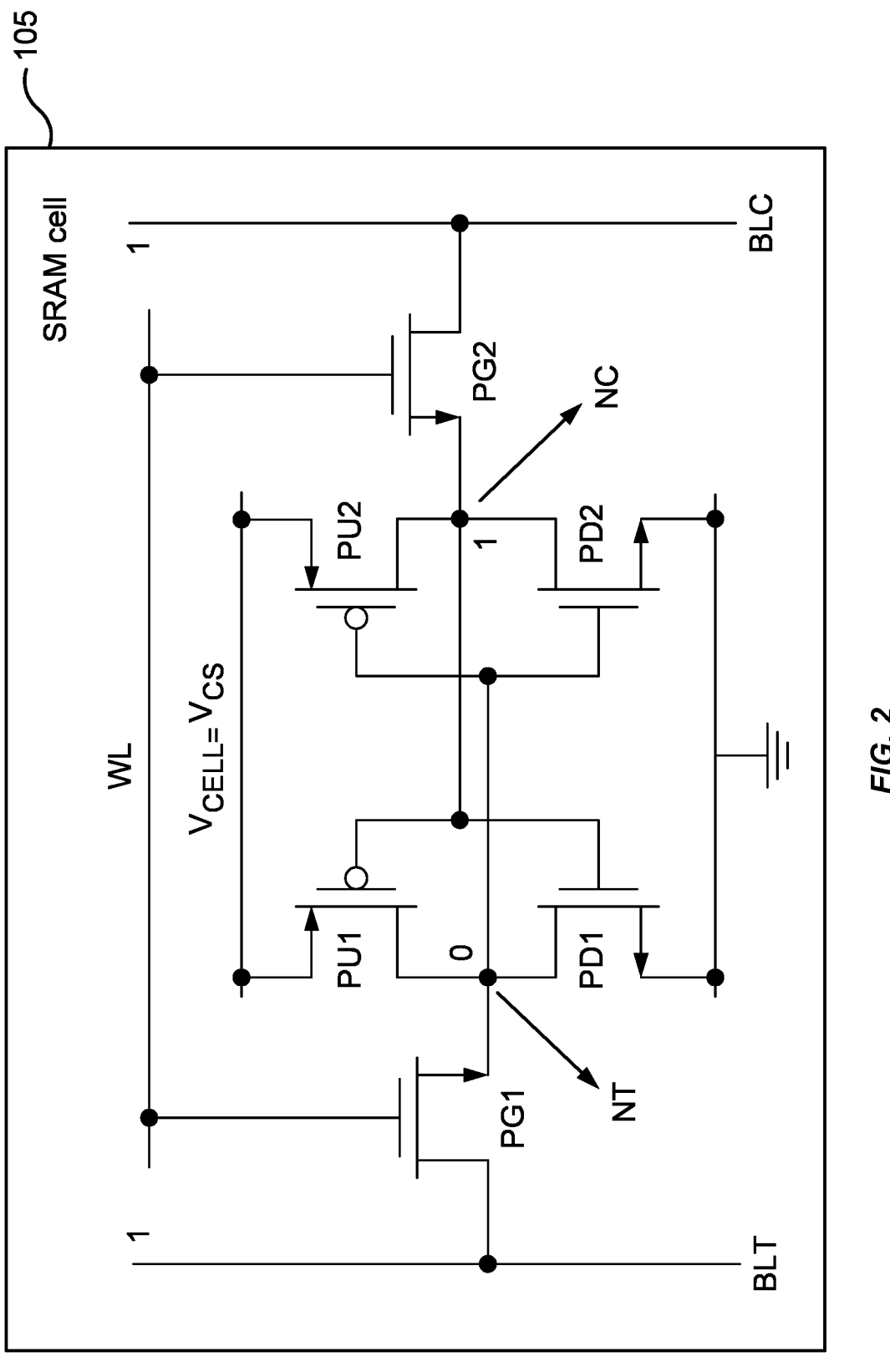
FIG. 2 illustrates a detailed version of a SRAM cell, according to one embodiment.

Boosting the WL of the selected row 115 makes the PG transistors in the SRAM cell stronger. FIG. 2 illustrates a detailed version of the SRAM cell 105 (e.g., a 6T SRAM cell) in FIG. 1, according to one embodiment. Boosting the WL can strengthen the transistors PG1 and PG2, which makes it easier to flip the cell 105. That is, the PG transistors more easily overcome the PU transistors when the WL is boosted. However, returning to FIG. 1, if in the SRAM array 100 the WL is boosted in unwritten (non-selected) SRAM cells in the selected row 115 (selected WL), the stability of these cells in the unselected columns 130 can degrade and flip the cell's logic value. That is, because boosting WL can cause the PG transistors in FIG. 2 to become stronger compared to the PD transistors, the NT voltage rises until exceeding a threshold (NT>VTHPD2) which may cause the stored values of the SRAM cells in the unselected columns 130 to flip.

To prevent this, in one embodiment the Vcells of the unselected columns 130 are boosted while the WL for the selected row 155 is also boosted which ensures the NT value remains below the threshold voltage VTHPD2. Boosting the Vcell of the unselected columns 130 during write operation of selected column 110 improves stability of the unselected SRAM cells 105, i.e., the PU2 transistor in FIG. 2 becomes stronger (the gate-source voltage ($V_{GS}$) increases) and the "1" logic state is preserved.

The column selection circuitry 125 powers all of the Vcells in the SRAM 100. That is, all of the columns 0-287 in the SRAM 100 receive power from the column selection circuitry 125 during the write operation. However, the column selection circuitry 125 boosts the power of the unselected columns 130 to have a higher voltage than the power supply that powers the selected column 110. That is, the column selection circuitry 125 drives the Vcells so that the Vcells <1-287> that power the unselected columns 130 have a higher voltage than the Vcell<0> powering the selected column 110. One implementation of the column selection circuitry 125 is provided in FIG. 7 below.

The SRAM 100 can be implemented in any integrated circuit (IC). For example, the SRAM 100 may be implemented in a central processing unit (CPU), graphical processing unit (GPU), system on a chip (SoC), application specific IC (ASIC), field programmable gate array (FPGA), and the like.

Figure 3:
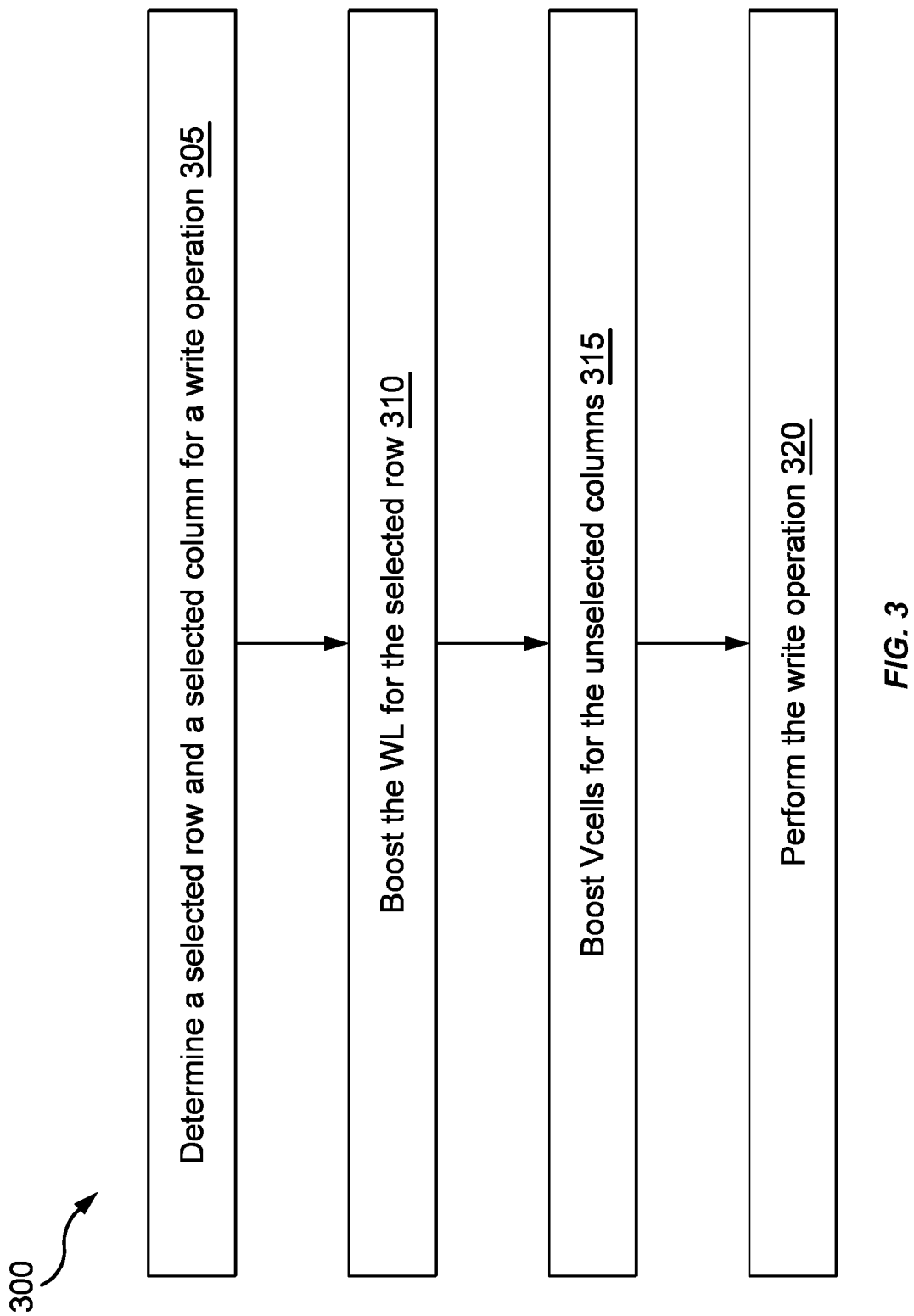
FIG. 3 is a flowchart for performing a write assist tech-nique, according to one embodiment.

FIG. 3 is a flowchart of a method 300 for performing a write assist technique, according to one embodiment. For ease of explanation, the blocks of the method 300 are discussed using the components discussed in FIG. 1.

At block 305, the SRAM 100 determines a selected row 115 and a selected column 110 for a write operation.

At block 310, the row selection circuitry 120 boosts a WL for the selected row 115. In one embodiment, the row selection circuitry 120 does not power any of the other WLs in the SRAM. That is, only the WL corresponding to the selected row is powered.

Moreover, boosting the WL can include raising the voltage of the WL above the voltage of a power supply. For example, the WL may be boosted to a voltage that is 5-15% higher than the voltage of the power supply.

At block 315, the column selection circuitry 125 boosts the Vcells for the unselected columns 130 in the SRAM 100. In addition to boosting the power of the Vcells for the unselected columns 130, the column selection circuitry can also power the Vcell for the selected column 110. However, the voltage of the Vcell for the selected column 110 is at a lower voltage (e.g., is not boosted) than the boosted voltage on the Vcells for the unselected columns 130.

Moreover, boosting the Vcells for the unselected columns 130 can include raising the voltage of the Vcells above the voltage of a power supply. For example, the Vcells may be boosted to a voltage that is 5-15% higher than the voltage of the power supply.

At block 320, the SRAM performs the write operation while the WL for the selected row 115 and the Vcells for the unselected columns 130 are boosted. For example, the SRAM may change the bit value being stored at the SRAM cell 105.

Figure 4:
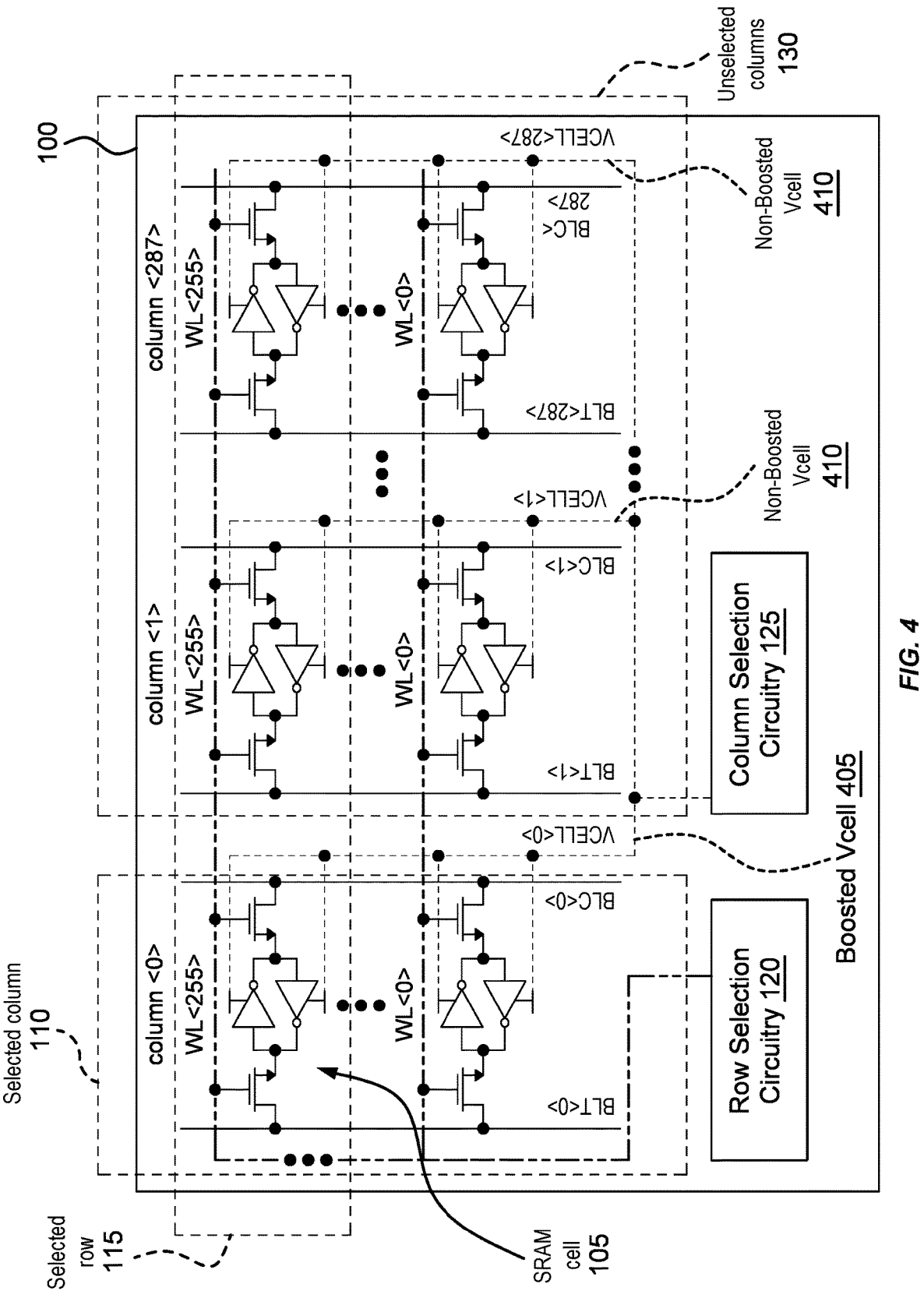
FIG. 4 illustrates a read assist technique for a SRAM, according to one embodiment.

FIG. 4 illustrates a read assist technique for the SRAM 100, according to one embodiment. The SRAM 100 is shown as having the same structure as the SRAM 100 in FIG. 1, and as such, the various components in FIG. 4 are not discussed in detail here. In this example, instead of performing a write operation, the SRAM 100 performs a read operation to read the bit value stored at the SRAM cell 105.

In this read assist technique, the column selection circuit 125 boosts the Vcell power supply for the selected column 110, but not for the unselected columns 130. That is, while the unselected columns 130 remain powered during the read operation, the column selection circuit 125 drives a higher voltage on the Vcell<0> for the selected column 110 (i.e., column 0). This read assist technique results in providing a boosted Vcell 405 to the selected column 110, but non-boosted Vcells 410 to the unselected columns 130.

Again referring the SRAM cell 105 shown in FIG. 2, in a read operation, the bit-lines (i.e., BLT and complementary bit lines BLC) are precharged to "1" and the WL is "1" for the selected row, which enables the PG1 and PG2 transistors such that current flows from BLT to ground through the PG1 transistor and the PD1 transistor. The voltage at the NT node increases during current flow.

If the stability of the cell 105 in FIG. 2 is weak (i.e., NT>VTHPD2), then boosting the supply voltage of cell supply (i.e., Vcell) strengthens and improves the stability and increases the cell current. Increasing the cell supply (i) increases a gate voltage level of the PD1 transistor, which makes the voltage at the NT node to move lower (e.g., NT<VTHPD2) and (ii) increases the voltage $V_{GS}$ in the PU2 transistor, which strengthens the PU2 transistor and preserves the "1" logic state. This also leads to a lower voltage at the NT node (e.g., NT<VTHPD2).

Moreover, during the read operation the memory can open a WL which opens each of the bits on the WL to a read. Even if only one bit of the entire row is read (e.g., the bit stored in the SRAM cell 105), each of the bits in the row may be partially read. Thus, each of the bits in the row (including the selected bit for read) are sensitive to stability during a read operation. As such, in one embodiment, the Vcell for the unselected columns <1-287> can also be boosted, along with the Vcell of the selected column. As such, if the SRAM is reading a partial row, it may boost the Vcell for every column <0-287>.

Figure 5:
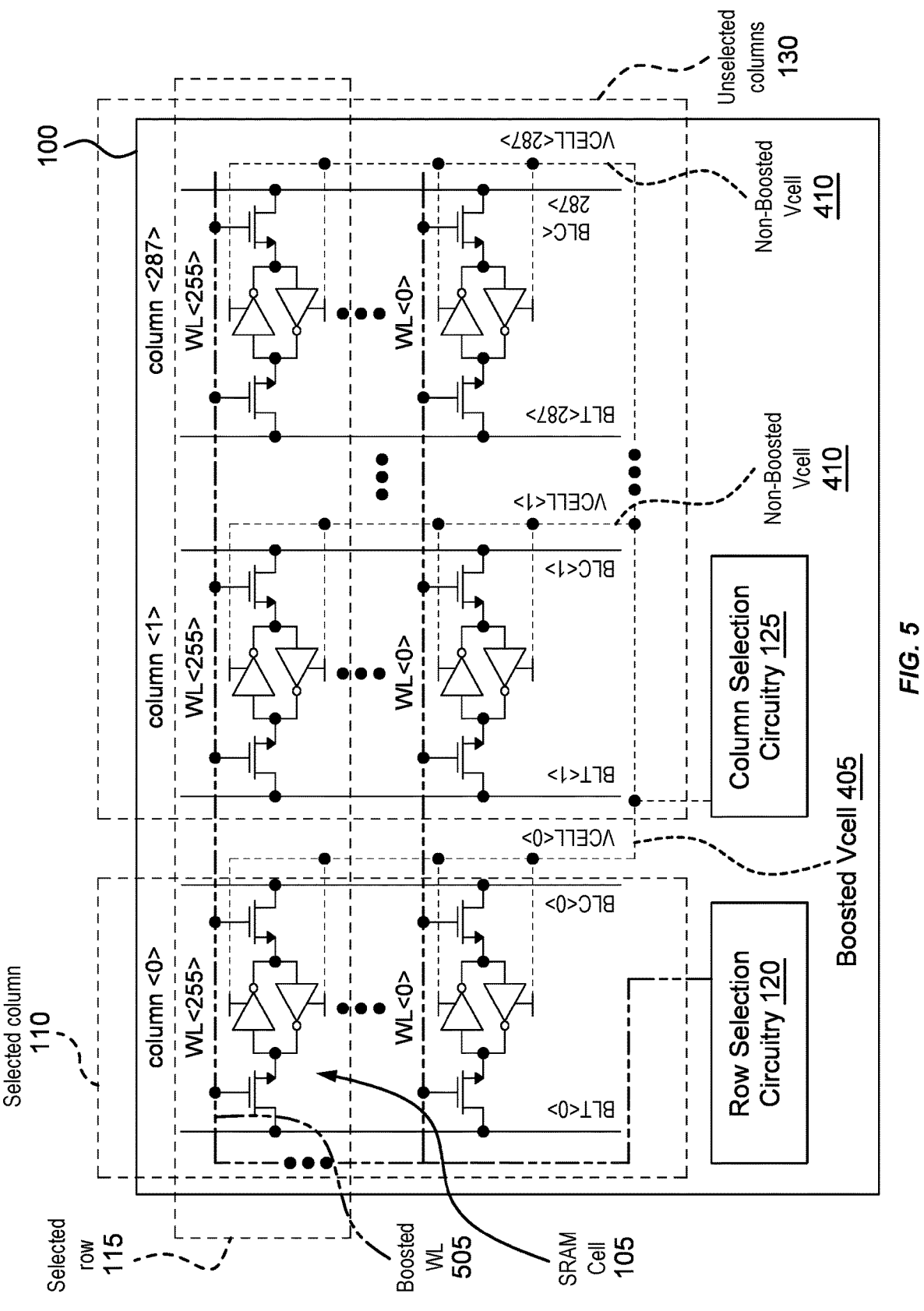
FIG. 5 illustrates a read assist technique for a SRAM, according to one embodiment.

FIG. 5 illustrates a read assist technique for a SRAM, according to one embodiment. Specifically, FIG. 5 illustrates a modified read assist technique than the one shown in FIG. 4. In addition to boosting the Vcell of the selected column 110, FIG. 5 illustrates also boosting the WL of the selected row 115 (i.e., the boosted WL 505). For example, in FIG. 4, the row selection circuit 120 may drive the WL for the selected row 115 using the voltage provided by the power supply. However, in FIG. 5, the row selection circuit boosts the WL for the selected row 115 so its voltage is greater than the voltage provided by the power supply.

Using the boosted WL 505 in addition with the boosted Vcell 405 can improve the stability of the SRAM cell 105 during a read operation and result in faster (e.g., improved) read time operation, such as faster bit line discharge rates.

Improving the read time (by reducing it) can enable faster cache cycle time. In one embodiment, the read assist technique in FIG. 5 can be used for increasing the cache density without degrading the cycle time (i.e., the addition of extra cells on a bit-line line). Thus, while FIG. 4 may use less power, further boosting the WL during a read operation as shown in FIG. 5 can improve stability and result in faster read times which can be used to enable faster cache cycle time, or to increase the density of SRAM cells in the SRAM without reducing the cycle time.

Figure 6:
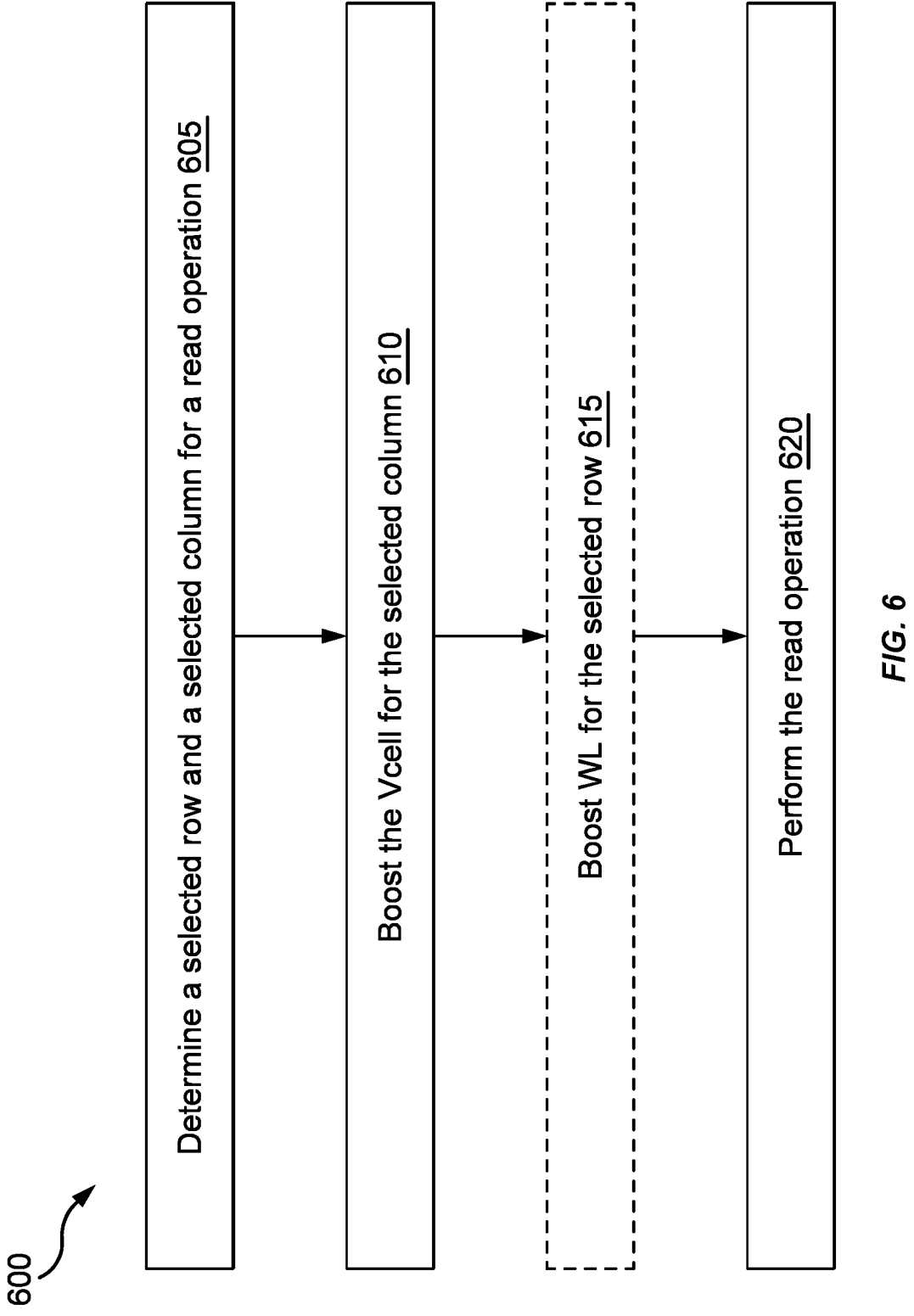
FIG. 6 is a flowchart for performing a read assist tech-nique, according to one embodiment.

FIG. 6 is a flowchart of a method 600 for performing a read assist technique, according to one embodiment. For ease of explanation, the blocks of the method 300 are discussed using the components discussed in FIGS. 4 and 5.

At block 605, the SRAM 100 determines a selected row 115 and a selected column 110 for a read operation.

At block 610, the column selection circuitry 125 boosts a Vcell for the selected column 110. In addition to boosting the power of the Vcell for the selected column 110, the column selection circuitry 125 can also power the Vcell for the unselected columns 130. However, the voltage of the Vcell for the selected column 110 is at a higher voltage than the boosted voltage on the Vcells for the unselected columns 130. This is shown in FIG. 4.

Moreover, boosting the Vcell can include raising the voltage of the Vcell above the voltage of a power supply. For example, the Vcells may be boosted to a voltage that is 5-15% higher than the maximum voltage of the power supply.

At block 615, the row selection circuitry 120 boosts the WL for the selected row 115. Block 615 is shown as dotted lines to indicate it is optional. For example, in FIG. 4, the WL for the selected row 115 is not boosted, while the Vcell for the selected column 110 is boosted. However, in FIG. 5, both the WL and the Vcell for the selected row and column are boosted.

In one embodiment, the row selection circuitry 120 does not power any of the other WLs in the SRAM. That is, only the WL corresponding to the selected row is powered.

Moreover, boosting the WL can include raising the voltage of the WL above the voltage of a power supply. For example, the WL may be boosted to a voltage that is 5-15% higher than the maximum voltage of the power supply.

At block 620, the SRAM performs the read operation while the Vcell for the selected column 110 is boosted, or while both the Vcell for the selected column 110 and the WL for the selected row 115 are boosted. For example, the SRAM may discharge the bit lines BLT and BLC of the selected SRAM cell 105 to determine the value that was stored in the cell 105.

Figure 7:
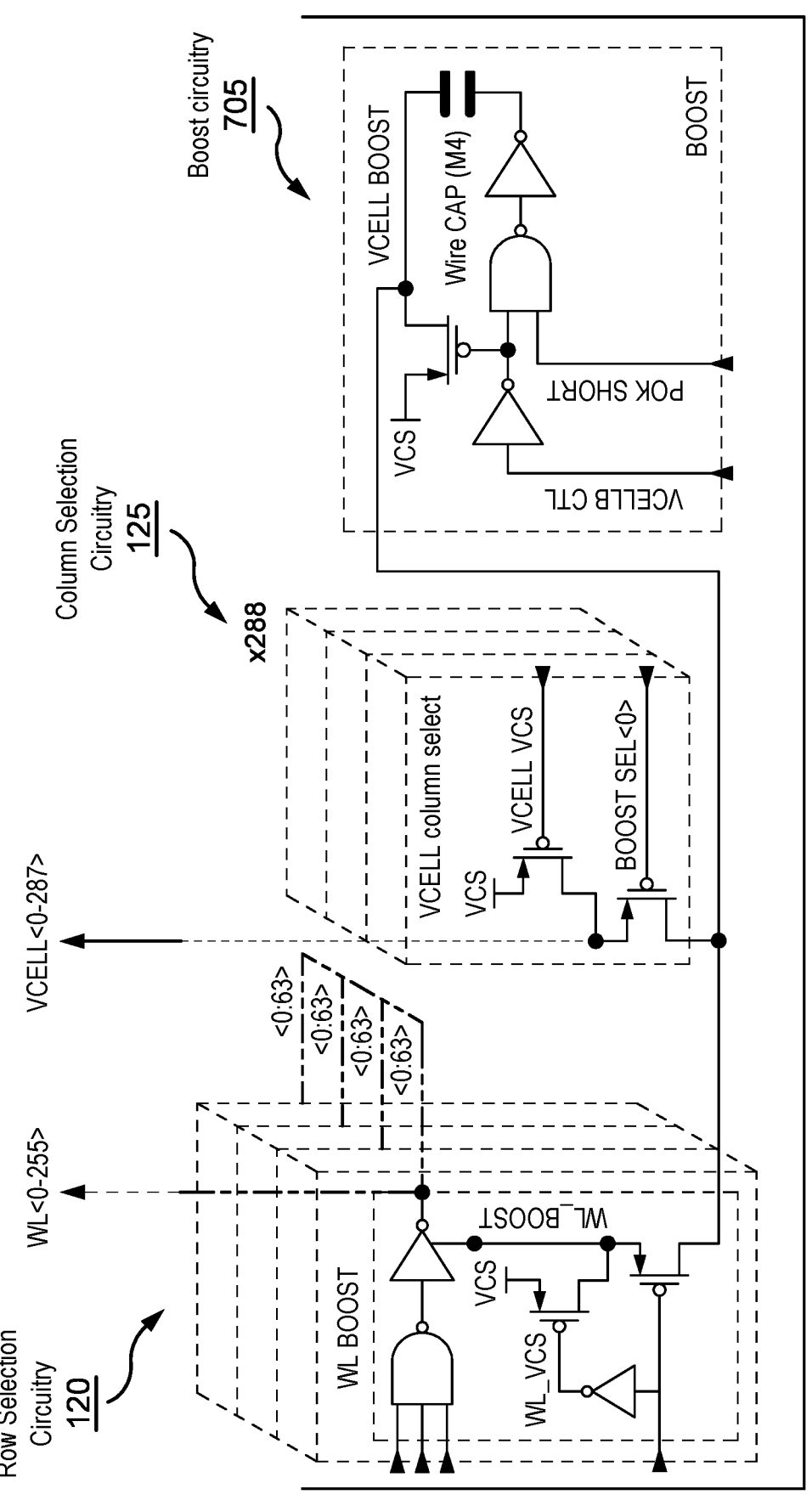
FIG. 7 illustrates row and column selection circuitry, according to one embodiment.

FIG. 7 illustrates row and column selection circuitry, according to one embodiment. That is, FIG. 7 illustrate one implementation of the row selection circuitry 120 and the column selection circuitry 125 discussed above. This is just one suitable example of the circuitry for selectively boosting the WLs and the Vcells in the SRAM.

FIG. 7 also illustrates boost circuitry 705 which is coupled to both the row selection circuitry 120 and the column selection circuitry 125. The boost circuitry 705 can boost the voltage provided to the row selection circuitry 120 and the column selection circuitry 125 to be above the power supply voltage (i.e., VCS). However, FIG. 7 illustrates just one suitable example of the boost circuitry 705 and the embodiments herein are not limited to any particular circuit for boosting the supply voltages provided to the row selection circuitry 120 and the column selection circuitry 125.

While the foregoing is directed to embodiments of the present invention, other and further embodiments of the invention may be devised without departing from the basic scope thereof, and the scope thereof is determined by the claims that follow.

What is claimed is:

1. A static random-access memory (SRAM) comprising:
an array comprising rows and columns of SRAM cells;
a plurality of word lines (WLs) corresponding to the rows of the SRAM cells; and
a plurality of cell supply voltages (Vcells) for powering the columns of the SRAM cells,
wherein the SRAM is configured to, during a write operation:
  boost a first WL of the plurality of WLs for a selected row of the rows of the SRAM cells, wherein a voltage on the first WL exceeds a power supply voltage coupled to a column selection circuitry that powers each of the Vcells in the SRAM; and
  boost a set of Vcells of the plurality of Vcells for powering unselected columns of the columns of the SRAM cells, wherein the unselected columns have a higher voltage than a selected column and wherein a voltage of the selected column is lower than the voltage on the first WL.

2. The SRAM of claim 1, wherein the SRAM is configured to, during the write operation:
provide a non-boosted voltage to a Vcell that powers the selected column of the columns of the SRAM cells, wherein the voltage of the Vcell that powers the selected column is less than the voltage of the set of Vcell that power the unselected columns.

3. The SRAM of claim 2, wherein the SRAM cell being written to during the write operation is at an intersection of the selected row and the selected column.

4. The SRAM of claim 1, wherein the write operation writes a bit value into a first subset of SRAM cells in the selected row, wherein a second subset of SRAM cells in the selected row located in the unselected columns are not being written to during the write operation.

5. The SRAM of claim 1, wherein, during the write operation, none of the other WLs besides the first WL are powered.

6. The SRAM of claim 1, wherein the SRAM cells are six transistor (6T) SRAM cells.

7. The SRAM of claim 1, wherein the first WL and the set of Vcells are boosted 5-15% relative to the power supply voltage.

8. A method, comprising:
determining a selected row and a selected column for a write operation in an array of SRAM cells;
boosting a first WL for the selected row during the write operation, wherein a voltage on the first WL exceeds a power supply voltage coupled to a row selection circuitry that powers each of the Vcells in the SRAM; and
boosting a set of Vcells for powering unselected columns in the array of SRAM cells during the write operation, wherein the unselected columns have a higher voltage than a selected column and wherein a voltage of the selected column is lower than the voltage on the first WL.

9. The method of claim 8, further comprising:
provide a non-boosted voltage to a Vcell that powers the selected column in the array of SRAM cells during the write operation, wherein the voltage of the Vcell that powers the selected column is less than the voltage of the set of Vcell that power the unselected columns.

10. The method of claim 9, wherein the SRAM cell being written to during the write operation is at an intersection of the selected row and the selected column.

11. The method of claim 8, wherein the write operation writes a bit value into a first subset of SRAM cells in the selected row, wherein a second subset of SRAM cells in the selected row located in the unselected columns are not being written to during the write operation.

12. The method of claim 8, wherein, during the write operation, none of the other WLs of the plurality of WLs besides the first WL are powered.

13. The method of claim 8, wherein the SRAM cells are six-transistor (6T) SRAM cells.

14. The method of claim 8, wherein the first WL and the set of Vcells are boosted 5-15% relative to the power supply voltage.

* * * * *